(12) United States Patent
Ina

(10) Patent No.: US 7,497,111 B2
(45) Date of Patent: Mar. 3, 2009

(54) SURFACE SHAPE MEASURING APPARATUS, SURFACE MEASURING METHOD, AND EXPOSURE APPARATUS

(75) Inventor: Hideki Ina, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 80 days.

(21) Appl. No.: 11/249,295

(22) Filed: Oct. 12, 2005

(65) Prior Publication Data
US 2006/0076488 A1 Apr. 13, 2006

(30) Foreign Application Priority Data
Oct. 12, 2004 (JP) ............................. 2004-297158

(51) Int. Cl.
*G01B 5/28* (2006.01)
(52) U.S. Cl. ........................................................ 73/105
(58) Field of Classification Search .................. 73/105; 250/306, 307
See application file for complete search history.

(56) References Cited

U.S. PATENT DOCUMENTS

| | | | |
|---|---|---|---|
| 4,861,162 A | 8/1989 | Ina | |
| 5,047,633 A * | 9/1991 | Finlan et al. ................. | 250/306 |
| 5,448,332 A | 9/1995 | Sakakibara et al. | |
| 5,508,527 A * | 4/1996 | Kuroda et al. ............. | 250/491.1 |
| 5,633,455 A * | 5/1997 | Quate .......................... | 73/105 |
| 5,693,439 A | 12/1997 | Tanaka et al. | |
| 5,908,981 A * | 6/1999 | Atalar et al. .................. | 73/105 |
| 6,066,265 A * | 5/2000 | Galvin et al. ................... | 216/2 |
| 6,072,764 A * | 6/2000 | Shido et al. ................. | 369/126 |
| 6,433,872 B1 | 8/2002 | Nishi et al. | |
| 6,516,528 B1 * | 2/2003 | Choo et al. .................... | 33/552 |
| 6,545,492 B1 * | 4/2003 | Altmann et al. ............. | 324/754 |
| 6,608,681 B2 | 8/2003 | Tanaka et al. | |
| 2002/0176082 A1 | 11/2002 | Sakakibara et al. | |
| 2005/0269035 A1 * | 12/2005 | Kawakami et al. .......... | 156/598 |

FOREIGN PATENT DOCUMENTS

JP           6-260391           9/1994

* cited by examiner

*Primary Examiner*—Daniel S Larkin
(74) *Attorney, Agent, or Firm*—Morgan & Finnegan LLP

(57) ABSTRACT

An apparatus measures a surface position of an object. The apparatus includes an array of members, each of which comprises a probe for an atomic force from the object and is configured to move in accordance with the atomic force, an optical system configured to project a measurement light onto each of the array of members and to receive the measurement light reflected off each of the array of members, and a detector configured to detect the measurement light directed through the optical system with respect to each of the array of members.

3 Claims, 14 Drawing Sheets

AN ARRANGEMENT
OF A 1 MM-INTERVAL
OF A SQUARE OF 35 MM$^2$

1 MM-INTERVAL
36 X 36 = 1296 PIECES

TIP OF EACH CANTILEVER

SURFACE SHAPE MEASURING APPARATUS, SURFACE MEASURING METHOD, AND EXPOSURE APPARATUS

BACKGROUND OF THE INVENTION

The present invention relates generally to an apparatus and method for measuring a surface position of an object, such as, though not exclusively, a wafer for a semiconductor device and a glass plate for a liquid crystal display ("LCD"). And the present invention is applicable, for example, to an exposure apparatus used in a lithography process for manufacturing a device, such as a semiconductor device, a LCD device and a thin-film magnetic head.

In manufacturing devices using the photolithography technology, a projection exposure apparatus has been conventionally employed which uses a projection optical system to project a circuit pattern of a mask (reticle) onto a wafer, etc. to transfer the circuit pattern.

The projection exposure apparatus is required to expose the reticle's circuit pattern onto the wafer with high resolution for finer and higher-density integrated circuits ("ICs"). The minimum critical dimension ("CD") to be transferred by the projection exposure apparatus or resolution is proportionate to a wavelength of light used for exposure, and inversely proportionate to the numerical aperture ("NA") of the projection optical system. The shorter the wavelength is, the better the resolution is. The recent light source has shifted from an ultra-high pressure mercury lamp (such as g-line with a wavelength of approximately 436 nm and i-line with a wavelength of approximately 365 nm) to a KrF excimer laser (with a wavelength of approximately 248 nm) and an ArF excimer laser (with a wavelength of approximately 193 nm). An $F_2$ laser (with a wavelength of approximately 157 nm) is about to reduce to practice. A further expansion of an exposure area is demanded.

A conventionally used step-and-repeat exposure apparatus (also referred to as a "stepper") exposes a reduced size of an approximately square exposure area onto a wafer. On the other hand, a step-and-repeat exposure apparatus (also referred to as to a "scanner"), which is suitable for precise exposure of a large screen and thus is about to become the main current, sets a rectangular or arc-shaped slit that is part of the exposure area and relatively scans the reticle and the wafer at a high speed.

In exposure, the scanner uses a surface-position detecting means of an oblique light projection system to measure a surface position of part of the wafer before the exposure slit area moves to the part of the wafer, and accords the part's surface with the best exposure image-plane position in exposing the part, thereby reducing influence of the wafer's flatness. In particular, plural measurement points are set in longitudinal direction of the exposure slit, i.e., a direction orthogonal to the scan direction, to measure the tilt of the wafer surface. Japanese Patent Application, Publication No. 6-260391, for example, discloses a wafer surface position measuring method for the scanner.

A brief description will be given of an exposure apparatus configuration that has a conventional wafer surface shape or position measuring apparatus. FIG. 13 is a block diagram of a schematic structure of the conventional exposure apparatus. The exposure light emitted from a light source 800 that uses, for example, an excimer laser, is shaped into an exposure slit having a predetermined shape suitable for exposure, and illuminates a patterned surface of the reticle 101. The patterned surface has a circuit pattern to be exposed, and the light that passes the circuit pattern forms a circuit pattern image on the imaging surface via a projection lens 102. A wafer 103 surface is located near the imaging surface.

The reticle 101 is held on a reticle stage RS that scans the reticle 101 in a Y direction. A wafer stage WS holds the wafer 103 and drives the wafer 103 in XYZ directions and around XYZ axes.

The circuit pattern of the reticle 101 is transferred onto a shot area as an area to be exposed on the wafer 103 by scanning the reticle stage RS and the wafer stage WS at a speed ratio corresponding to the exposure magnification. After exposure to one shot area (one shot exposure) ends, the wafer stage WS steps the wafer 103 to the next shot area for the scanning exposure in the −Y direction, inverse to the just previous scanning direction. A series of these actions is referred to as a step-and-scan exposure method unique to the scanner. The step-and-scan action exposes all the shot areas on the wafer 103.

During scanning in the one shot exposure, a focus and tilt detection system 133 obtains surface position information of the wafer 103 surface, and calculates a shift amount from the exposure image plane. The stage actions in the Z and tilt directions correct a position on the wafer 103 surface at almost an exposure slit unit. FIG. 14 shows a schematic structure of the focus and tilt detection system 133, but a detailed description thereof will be omitted because details of this structure is disclosed in Japanese Patent Application, Publication No. 6-260391.

The focus and tilt detection system 133 optically measures a height of the wafer 103 surface. The light is incident at a highly incident angle upon the wafer 103 surface, more particularly, the resist surface applied onto the wafer 103, and a position detector, such as a CCD, detects a shift of a reflected light image. The light is incident upon plural measuring points on the wafer 103, and the reflected light is guided to a separate position detector to detect the height of the wafer 103 surface at a different position. Based on the measuring result, a position of the wafer 103 is corrected in the Z direction and/or tilt direction (in a rotational direction around the X-axis direction and/or in a rotational direction around the Y-axis).

For the finer and higher-density ICs, the drastically reduced depth of focus ("DOC") of the exposure optical system narrows latitude in aligning an exposed wafer surface with the best focus position or requires stricter focus precision. As a result, the influence of a pattern formed on the wafer and a measuring error of the surface position detection system caused by the uneven resist thickness cannot become negligible.

FIG. 9 is an explanatory view for explaining reflectance changes associated with the resist thickness changes due to the patterned steps on the wafer. The reflectance on the resist applied wafer depends upon the influence between the reflected light on the resist front surface and the reflected light on the resist back surface (or wafer pattern front surface). Since a resist thickness Rt' in a step part B is greater than a resist thickness Rt in a non-stepped area A on the wafer, an optical-path difference dA between reflected light ka1 on the resist front surface and reflected light ka2 on the resist back surface with respect to the light incident upon the area A is different from an optical-path difference dB between reflected light kb1 on the resist front surface and reflected light kb2 on the resist back surface with respect to the light incident upon the area B. As a result, the reflectance differs between the areas A and B. An asymmetrical signal waveform occurs when a projected image or measuring light of a grating pattern on a patterned plate is incident upon the areas having different reflectance changes. This reflectance changes occur not only in the simple resist thickness changes as in FIG. 9, but also another cause as in FIG. 10. FIG. 10 is a view for explaining a reflectance difference between an area C having no pattern or a low pattern density and an area D having a high pattern density. The resist thickness is equal between the areas C and D, and reflected lights kc1 and kd1 have almost the same reflectance on the resist front surface between the areas C and D. However, the areas C and D have different pattern densities, and reflected lights kc2 and kd2 have different reflectances on the resist back surface. In addition, when the wafer pattern structure is smaller than the wavelength of the illumination light, a phase jump phenomenon of the reflected light occurs, which is referred to as structural birefringence, and causes a phase difference between the reflected lights kc2 and kd2 on the resist back surface. Thereby, the areas C and D have different reflectances.

Since the reflection angle and reflected light intensity thus change according to wafer patterns, the detected waveform originating from the received reflected light contains asymmetry, consequently causing a detection error, remarkably lowers the contrast of the detection waveform, and hindering a precise detection of a surface position. In particular, for a wafer pattern size smaller than 65 nm, the focus measuring accuracy should be maintained lower than several nanometers, and the current optical measurement alone has a difficulty in maintaining the sufficient focus precision.

BRIEF SUMMARY OF THE INVENTION

Accordingly, it is an exemplary object of the present invention to provide technology that can precisely measure a surface position of an object.

An apparatus for measuring a surface position of an object includes an array of members, each of which comprises a probe for an atomic force from the object and is configured to move in accordance with the atomic force, an optical system configured to project a measurement light onto each of the array of members and to receive the measurement light reflected off each of the array of members, and a detector configured to detect the measurement light directed through the optical system with respect to each of the array of members.

A method according to another aspect of the present invention of measuring a surface position of an object includes steps of reducing a gap between the object and an array of members, each of which comprises a probe for an atomic force from the object and is configured to move in accordance with the atomic force, projecting a measurement light onto each of the array of members through a projection optical system, receiving the measurement light reflected off each of the array of members through a receiving optical system, detecting the measurement light directed through the receiving optical system with respect to each of the array of members by a detector, and obtaining the surface position with respect to each of the array of members based on an output of the detector.

An exposure apparatus according to still another aspect of the present invention for exposing an object to light through a mask includes the above apparatus for measuring a surface position of the object, and a stage configured to hold the object and to move based on the measured surface position.

A method of manufacturing a device according to yet still another aspect of the present invention includes steps of exposing an object to light through a mask using the above exposure apparatus, developing the exposed object, and processing the developed object to manufacture the device.

Other objects and further features of the present invention will become readily apparent from the following description of the preferred embodiments with reference to accompanying drawings.

DETAILED DESCRIPTION OF THE PREFERRED EMBODIMENTS

First Embodiment

Referring now to the accompanying drawings, a description will be given of an exposure apparatus S according to a first embodiment of the present invention. The exposure apparatus S includes an exposure apparatus disclosed, for example, in U.S. Pat. No. 4,861,162, and an inventive surface shape or position measuring apparatus.

Figure 1:
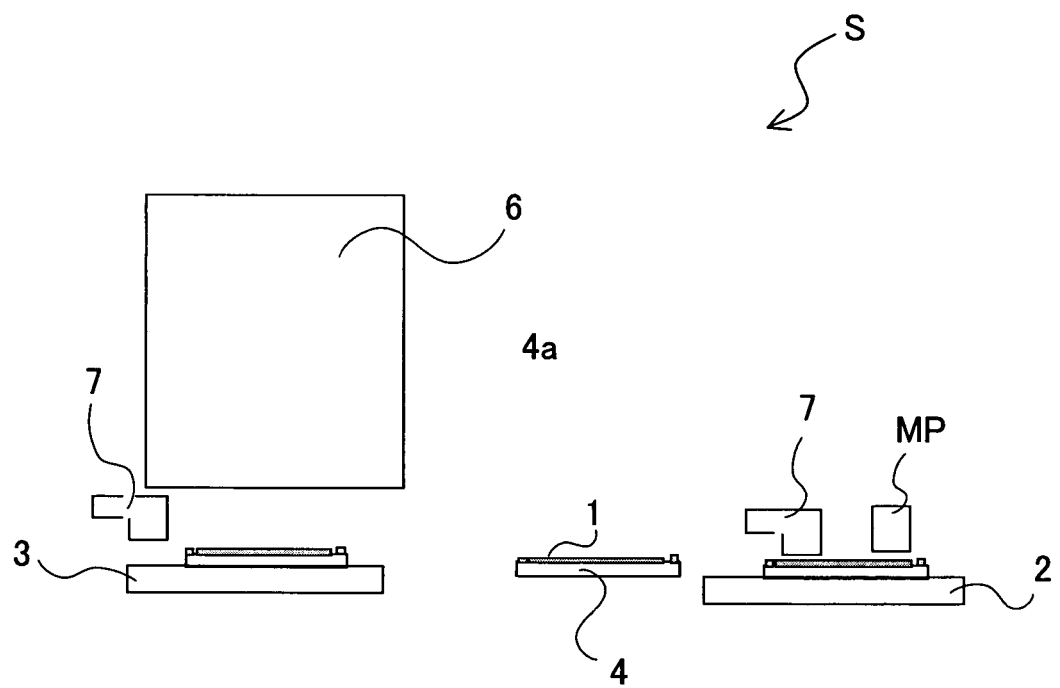
FIG. 1 is a schematic structure of principal part of an exposure apparatus according to a first embodiment of the present invention.

With reference to FIG. 1, a wafer 1 is fed between two wafer driving stages, i.e., a measuring stage 2 and an exposure stage 3 while absorbed on a chuck 4. The light guided by a projection optical system 6 is projected onto the wafer 1 on the exposure stage 3. A chuck mark 4 is provided on the chuck 4 to measure a position of the wafer 1, and an alignment detection system 7 measures a three-dimensional positional relationship between the chuck mark 4a and the wafer 1 on the measuring stage 2. Thereafter, the chuck 4 moves to the exposure stage 3 while absorbing the wafer 1. The alignment detection system 7 measures a three-dimensional position of the chuck mark 4a on the exposure stage 3. A three-dimensional position of the wafer 1 in the XYZ direction on the exposure stage is detected based on the measuring result and positional relationship information between the above wafer 1 and the chuck mark 4a.

Figure 2:
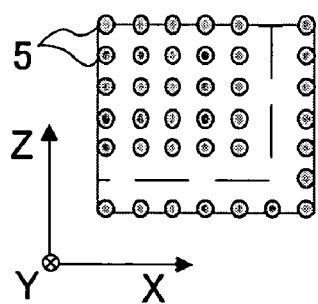
FIG. 2 is a view of an arrangement example of a cantilever in a focus detection system in the exposure apparatus shown in FIG. 1.
Figure 3:
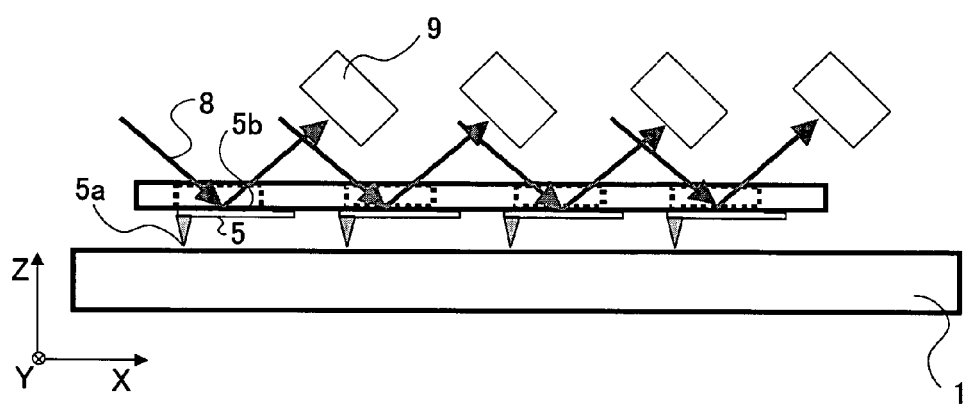
FIG. 3 is a side view of a multi-cantilever measuring a wafer surface in the exposure apparatus shown in FIG. 1.

The measuring stage 2 houses a focus detection system MP that serves as a surface position measuring apparatus and uses plural cantilevers 5 (see FIG. 3). FIG. 2 shows an illustrative arrangement of the cantilevers 5 in the focus detection system MP. For example, thirty-six cantilevers 5 are arranged along the length and width at regular intervals of 1 mm in the square region having a side of 35 mm; totally twelve hundred ninety-six cantilevers 5 are arranged, and an array of the cantilevers 5 is referred to as a multi-cantilever 5c.

Figure 9:
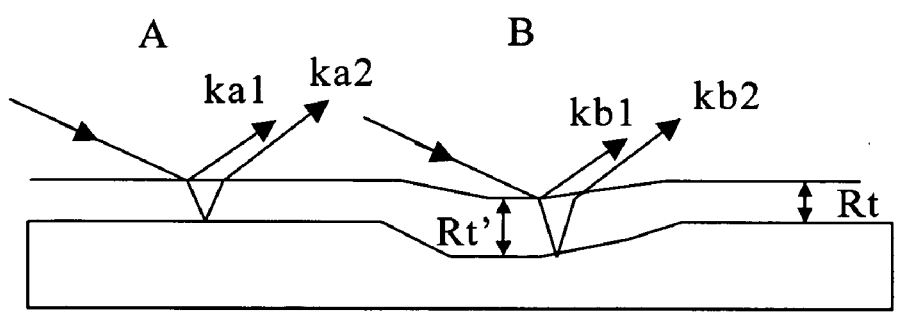
FIG. 9 is a view for explaining the optical offset.
Figure 10:
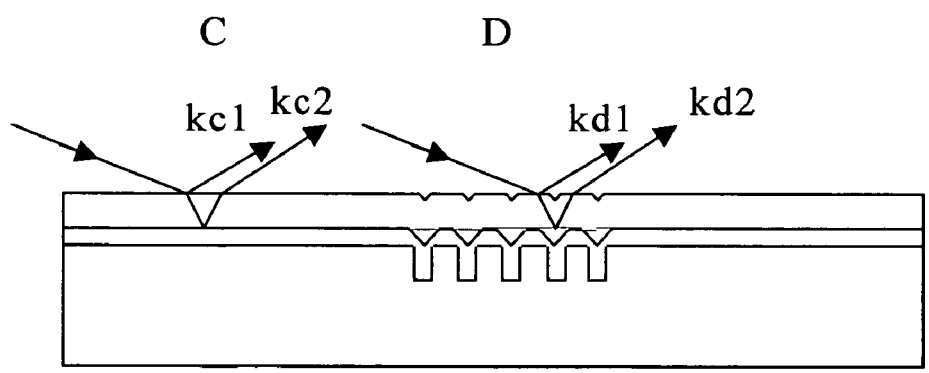
FIG. 10 is a view for explaining the optical offset.

The cantilever 5 is used for a commercially available atomic force microscopy ("AFM") etc., and measures an object position in the Z direction perpendicular to the paper surface by utilizing the atomic force that acts between the object and the cantilever 5 and can contain the van der Waal's force. Use of the atomic force would provide precise measurements of the surface shape or position of the resist applied on the wafer 1 without a measuring offset or error unlike the optical measurement in FIGS. 9 and 10.

FIG. 3 is a side view of the multi-cantilever 5c that has plural cantilevers 5 and measures the surface of the wafer 1. The measuring method of the cantilever 5 is referred to as an optical lever method. The cantilever 5 longitudinally moves in accordance with the height position of the wafer 1 surface by the atomic force that acts between a measuring probe 5a and the wafer 1 surface. The oblique incident light 8 is incident upon a back surface 5b of the cantilever 5, and an optical detector 9, such as a CCD, detects the reflected light from the back surface 5b, thereby measuring the height of the cantilever 5 or the surface shape or position of the wafer.

Figure 4:
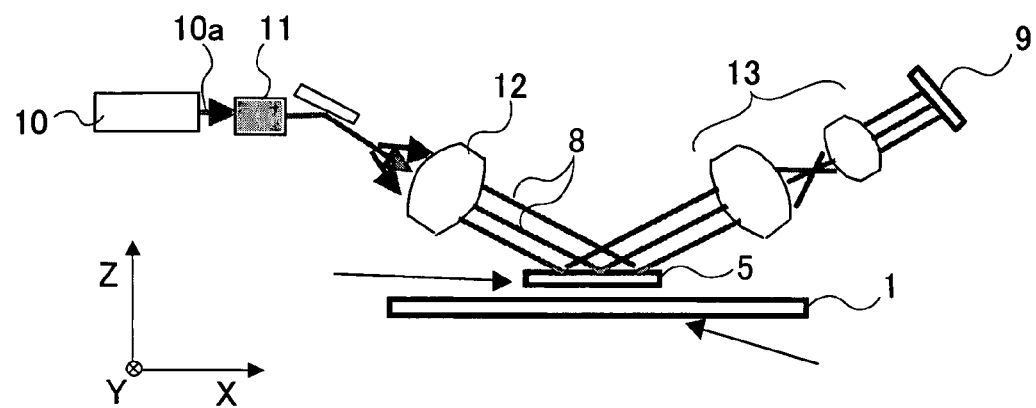
FIG. 4 shows a schematic structure of an optical lever type focus detection system that measures a height using a single optical system and plural cantilevers.

FIG. 4 shows a schematic structure of the optical lever type focus detection system MP that measures the heights of the plural cantilevers 5 through a single optical system. A multi-spot generator 11 splits measuring light 10a emitted from a laser light source 10, whereby the oblique incident light 8 is incident upon the back surface 5b of each cantilever 5 though a projection optical system 12. A light-receiving optical system 13 guides the reflected light from each of plural back surfaces 5b to a light-receiving surface of the optical detector 9. While the commercially available AFM uses a tetramerous sensor as the optical detector, this embodiment uses a two-dimensional image-pickup device, such as an area-type CCD. Since the light-receiving position on the optical detector 9 varies in accordance with the height position of the back surface 5b of the cantilever 5 in the Z direction, the position of the cantilever 5 in the Z direction can be measured by photo-electrically converting the light received at the optical detector 9.

The measuring stage 2 measures the surface of the wafer 1 in accordance with the following measuring sequence before the wafer 1 is exposed in the exposure stage 3. Initially, plural cantilevers 5 measure the surface shape of the shot area to be initially exposed on the wafer 1 (step 1). Next, the wafer stage is driven and plural cantilevers 5 measure the surface shapes of other shot areas (step 2). When the measurements of surface shapes of all the shots are completed, the alignment detection system (or off-axis scope) 7 starts the wafer alignment measurement, in accordance with the global alignment in most cases, and obtains the positional information on the wafer 1 in the XY directions (step 3). The alignment detection system 7 measures the XYZ position of the chuck mark 4a on the chuck 4 (step 4). Thereafter, the chuck 4 moves to the exposure stage 3 while absorbing the wafer 1 so as to expose the wafer 1, and a new undetected wafer 1 is set onto the measuring stage 2 (step 5). The exposure sequence is the same as the conventional manner, and a description thereof will be omitted.

Figure 5:
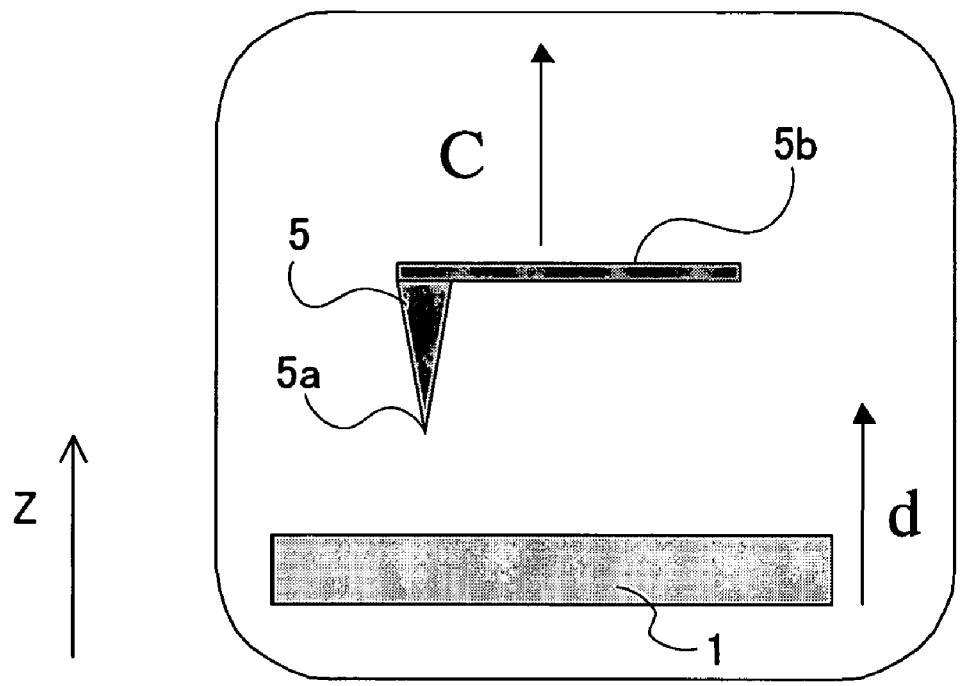
FIG. 5 is an explanatory view for explaining a principle of a wafer surface measurement using the cantilevers.
Figure 6:
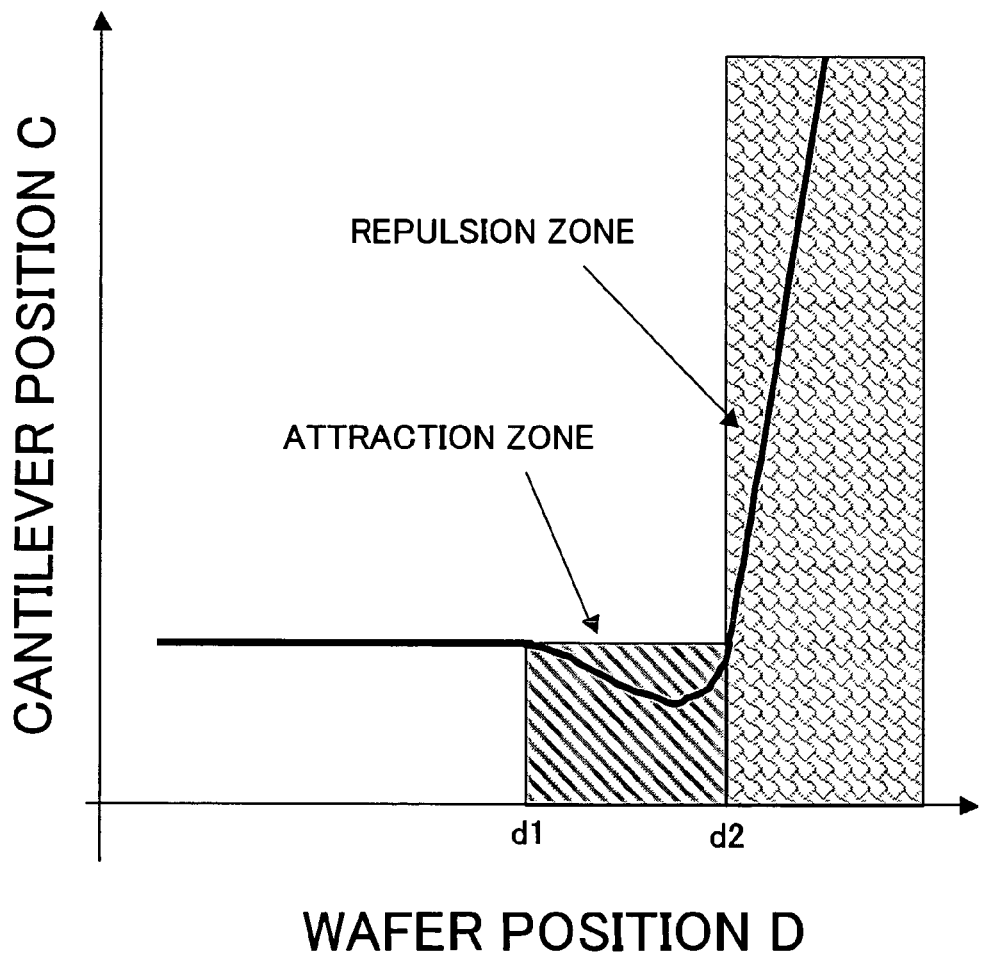
FIG. 6 is a graph showing a relationship between a position of the cantilever C and the wafer's surface position d when the wafer is gradually brought close to the cantilever.

FIG. 5 is an explanatory view for explaining the surface measurement principle of the wafer 1 by utilizing the cantilevers 5. FIG. 6 shows a relationship between a position C of the cantilever 5 in the Z direction from a predetermined reference position, such as the position of the back surface 5b of the cantilever 5, and a surface position d of the measuring point on the wafer 1 as an object to be measured the surface when the wafer 1 is gradually brought close to the cantilever that is held on the position C, where the Z or upper direction in FIG. 5 is set to a positive direction.

When the cantilever 5 is located sufficiently apart from the wafer 1, the position C of the cantilever 5 does not change even when the wafer 1 is brought close to the cantilever 5. However, as the wafer 1 becomes close to the cantilever 5 to some extent where a distance between the wafer 1 surface and the probe 5a of the cantilever 5 is a predetermined distance and the surface position of the wafer 1 reaches a position d1, the attracting atomic force affects between them. Thereafter, as the wafer 1 is further brought close to the cantilever 5, the cantilever 5 is attracted to the wafer 1 surface and a value of the position C of the cantilever 5 gradually decreases in the attraction zone. As the wafer 1 is further brought close to the cantilever 5 and the surface position of the wafer 1 becomes a position d2, both repel due to the atomic force. As the wafer 1 further approaches the cantilever 5, the cantilever 5 separates from the wafer surface 1 due to the repulsion and a value of the position C of the cantilever 5 suddenly increases in the repulsion zone. This embodiment utilizes the repulsion characteristic in the repulsion zone, and thus sets a distance between the cantilever 5 and the wafer 1 to C-d2 or smaller. Alternatively, the present invention may use the attraction characteristic in the attraction zone. However, there may be plural positions of the wafer 1 corresponding to the position C of a single cantilever 5 in the attraction range, it should be noted that the position of the wafer 1 may not be uniquely determined from the position C of the cantilever 5. In setting a distance between the cantilever 5 and the wafer 1, the surface shape of the wafer 1 or scattering of its height should be considered. This is because when the distance between the cantilever 5 and the wafer 1 is smaller than a height scattering value of the wafer 1, the probe 5a of the cantilever 5 may contact the wafer 1 surface.

In producing the multi-cantilever 5c by arranging, for example, a thousand or more cantilevers 5, the height scatters of the nanometer order. Therefore, calibration that uses a sample tool or so-called jig having a known flatness is needed to correct the height scattering among plural cantilevers 5 before the surface of the wafer 1 is measured. A description will now be given of the calibration procedure in correcting the height scattering of the cantilever 5 within the precision of 3 nm.

A sample wafer as a jig having a known flatness is set 500 nm under the tip of the probe 5a of the multi-cantilever 5c. While the sample wafer is being moved in the +Z direction toward the multi-cantilever 5c, a position of each cantilever 5 in the multi-cantilever 5c is optically measured in the Z direction whenever the sample wafer moves by 5 nm.

This procedure repeats until the moving distance becomes 600 nm, and the measuring data is obtained at totally 120 points. The force curve of each cantilever 5 is produced based on each measuring data so as to detect a position d2 in FIG. 6 of a transition point that transits from the attraction zone to the repulsion zone of each cantilever 5. The height scattering of each cantilever 5 is calculated based on the information of the position d2 of the transition point of each cantilever 5 and the flatness of the sample wafer. The height scattering influence of the cantilever 5 of the nanometer order can be made minimum by applying the calculated height scattering information of each cantilever 5 to the surface shape measurement of the actual wafer 1. Use of an average value of totally four calibrations as a result of rotating the sample wafer every 90° on the XY plane would further reduce the influence of the flatness of the sample wafer.

As discussed above, the first embodiment combines a non-optical measurement using the multi-cantilever 5 with an optical measurement, and optically measures a position of the multi-cantilever 5 corresponding to the wafer surface position. This embodiment thus does not cause a measuring offset or error that would otherwise occur in the conventional method of optically measuring the position of the surface shape of the resist applied onto the wafer. The calibration minimizes the height scattering influence or manufacturing errors of the multi-cantilever, and provides precise measurements of the nanometer order.

Second Embodiment

Figure 7:
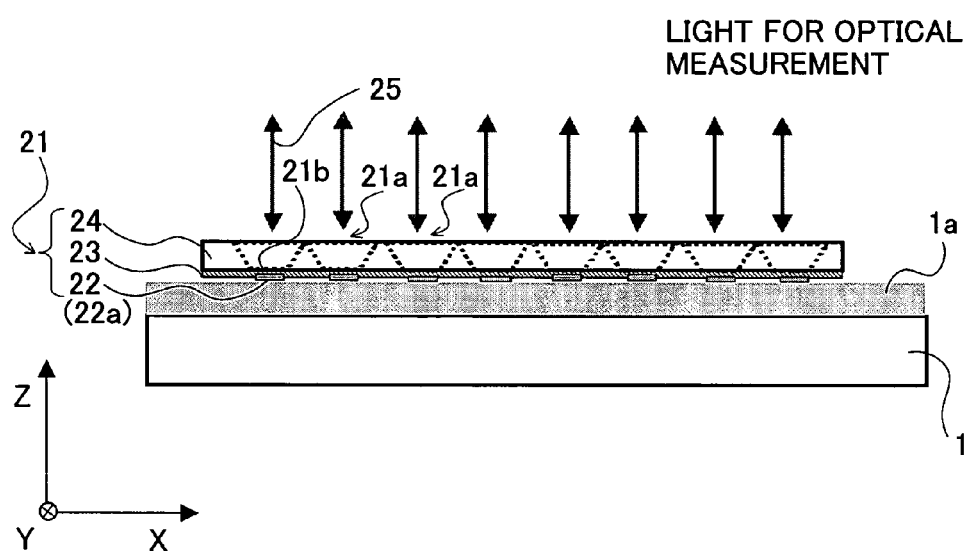
FIG. 7 is a side view of a multi-cantilever for an exposure apparatus according to a second embodiment of the present invention.
Figure 8:
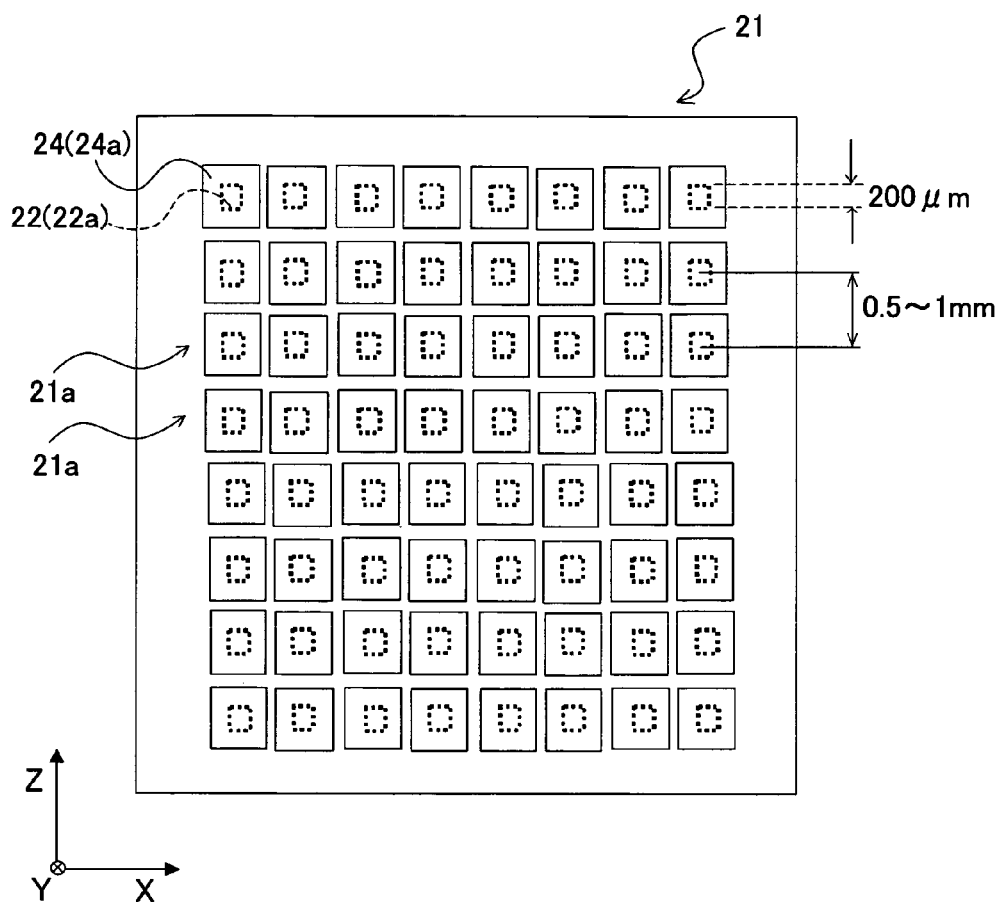
FIG. 8 is a top view of the multi-cantilever shown in FIG. 7.

A description will be given of an exposure apparatus S2 according to a second embodiment of the present invention. FIG. 7 is a side view of a multi-cantilever 21 as a surface shape measuring apparatus used for the exposure apparatus S2 according to the second embodiment of the present invention. FIG. 8 is a top view of the multi-cantilever 21. The multi-cantilever 21 has a structure referred to as a silicon-on-insulator ("SOI"). SIO contains a first S1 layer 22 that has a thickness, for example, of 100 nm or smaller, a second $SiO_2$ layer 23 that has a thickness of 10 nm or smaller, and a third Si layer 24 that has a thickness of about several millimeters. The first layer 22 has an approximately square shape having each side of, for example, 200 μm, and serves as a probe 22a of the multi-cantilever 21. Eight probes 22a are arranged in the longitudinal and lateral directions at regular intervals of about 0.5 to 1 mm; totally sixty-four probes 22a are arranged as shown in FIG. 8. The third layer 24 has an approximately pyramid concave part 24a is formed by back-etching and corresponds to each probe 22a. One cantilever 21a includes the concave part 24a and the probe 22a.

While the commercially available AFM acquires the horizontal resolution on the XY plane by using a probe having a tip size of several tens nanometers, the horizontal resolution of about several 100 nanometers is enough for the exposure apparatus S2 of the second embodiment because a scanner uses an exposure slit having a width of several millimeters. Therefore, no problem occurs when the probe 22a has an approximately square shape having one side of 200 μm. This structure reduces a fine noise component on the surface shape of the resist 1a, and provides an averaging effect as well as other effects of a protection of the resist 1a from damages and a protection of the multi-cantilever 21 from deformations due to the long-term use. For these effects, each side of the probe 22a is preferably 30 nm or greater or each probe 22a preferably has an area of 900 $nm^2$ or greater.

As shown in FIG. 7, the measuring light 25 for measuring the height position of each cantilever 21a can be incident approximately perpendicular upon the back surface of the cantilever 21a in the multi-cantilever 21. The perpendicular incidence of the measuring light 25 can provide an interference shape measurement that measures a shape utilizing the interference of the light. The oblique incidence of the measuring light 25 is applicable to FIG. 7, and provides highly precise measurements of the heights of the cantilevers 21a by utilizing an incident angle as a variable.

Third Embodiment

While the first embodiment plural wafer driving stages, i.e., the measuring stage 2 and the exposure stage 3, this embodiment uses a single wafer driving stage for both the wafer surface shape measurement and exposure. Although the measurement and exposure throughputs become lower than those with plural wafer driving stages, this embodiment can reduce the cost with a smaller size of the entire apparatus. Since the chuck 4 that holds the wafer 1 does not have to be transferred to a different wafer driving stage between the measurement and the exposure, no chuck mark 4a is needed because no measurement of a three-dimensional position of the wafer 1 is required based on the shuck mark 4a.

Fourth Embodiment

In the first to third embodiments, the multi-cantilevers 5c and 21 measure the entire shot area by a single action. In other words, the measurable range or area of a surface shape by each of the multi-cantilevers 5c and 21 by a single action is wider than a single shot area. Alternatively, for example, a smaller multi-cantilever that is arranged in an area smaller than the shot area can measure a surface shape of a single shot through plural measurements. After the smaller multi-cantilever measures part of the surface shape on the shot area, the wafer 1 is moved and measurement of the surface shape is resumed. This procedure is repeated plural times and the surface shape of the overall shot area is measured. Plural pieces of obtained measuring data are coupled by the subsequent processing.

As the number of measurements increases the measuring throughput decreases. However, the measurement of the fourth embodiment is effective when it is difficult due to a measuring precision or another cause to manufacture the multi-cantilevers 5c and 21 that have plural cantilevers 5 and 21a and can measure an area wider than the shot area. Of course, the measuring offset or error does not occur unlike the conventional optical measurement.

Fifth Embodiment

Figure 11:
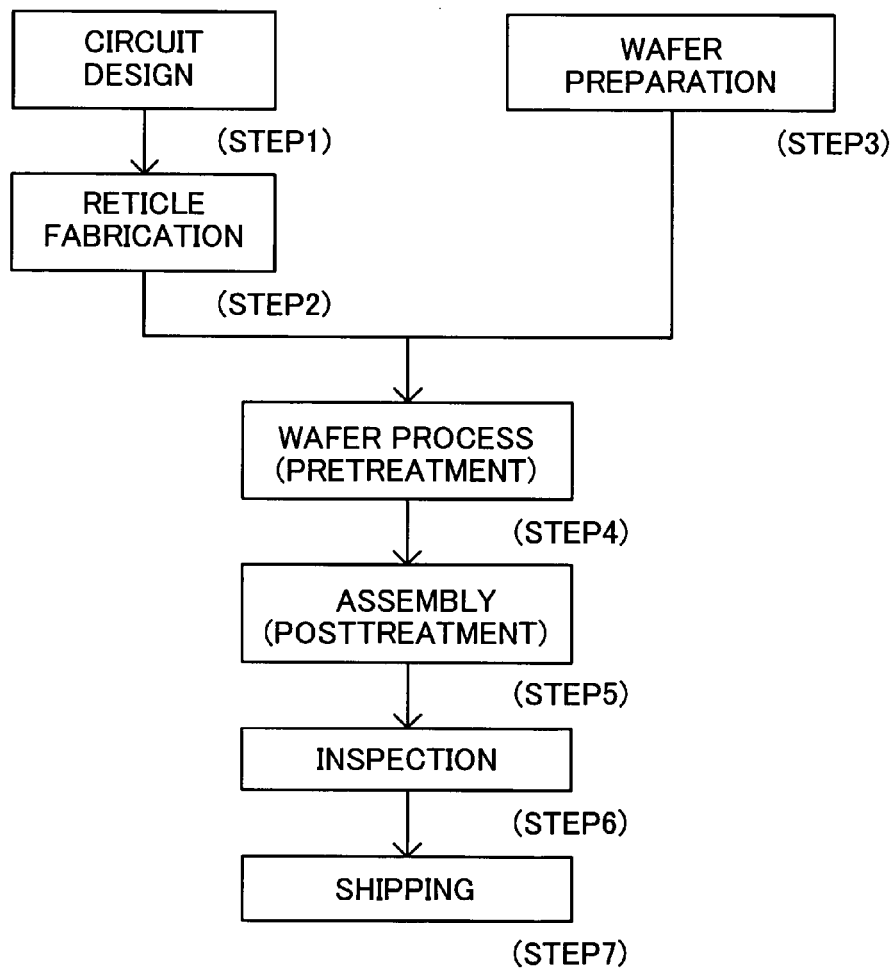
FIG. 11 is a flowchart for explaining manufacture of devices (such as semiconductor chips such as ICs and LCDs, CCDs, and the like) using the exposure apparatus shown in FIG. 1.
Figure 12:
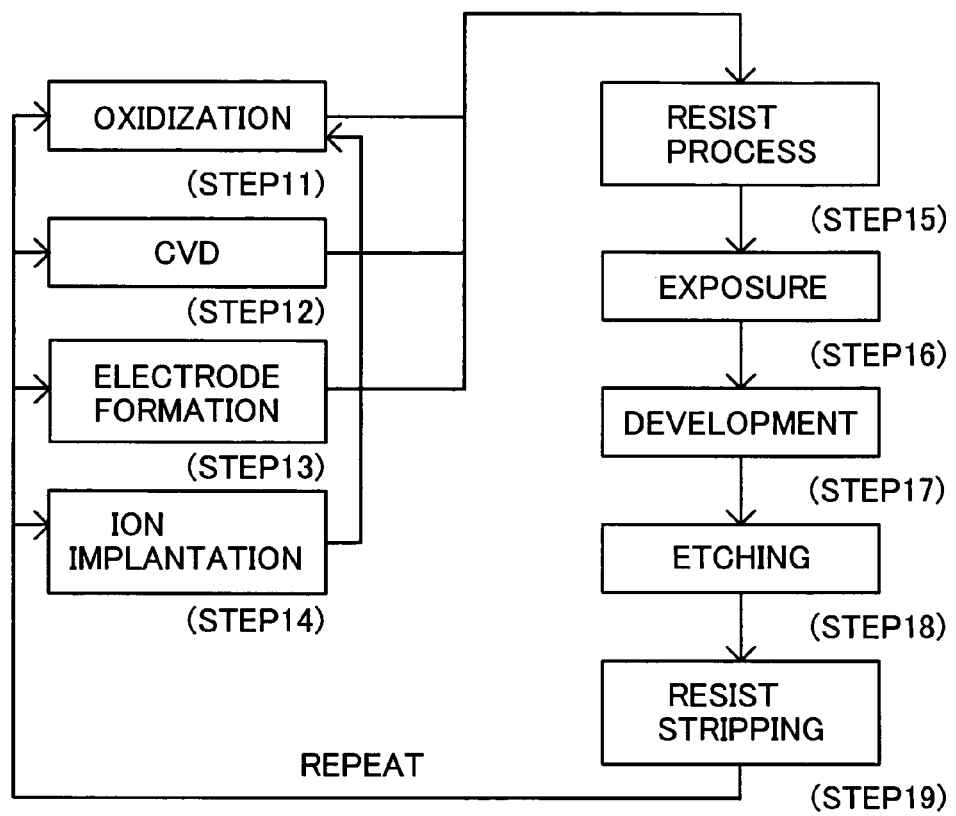
FIG. 12 is a detail flowchart of a wafer process as Step 104 shown in FIG. 11.
Figure 13:
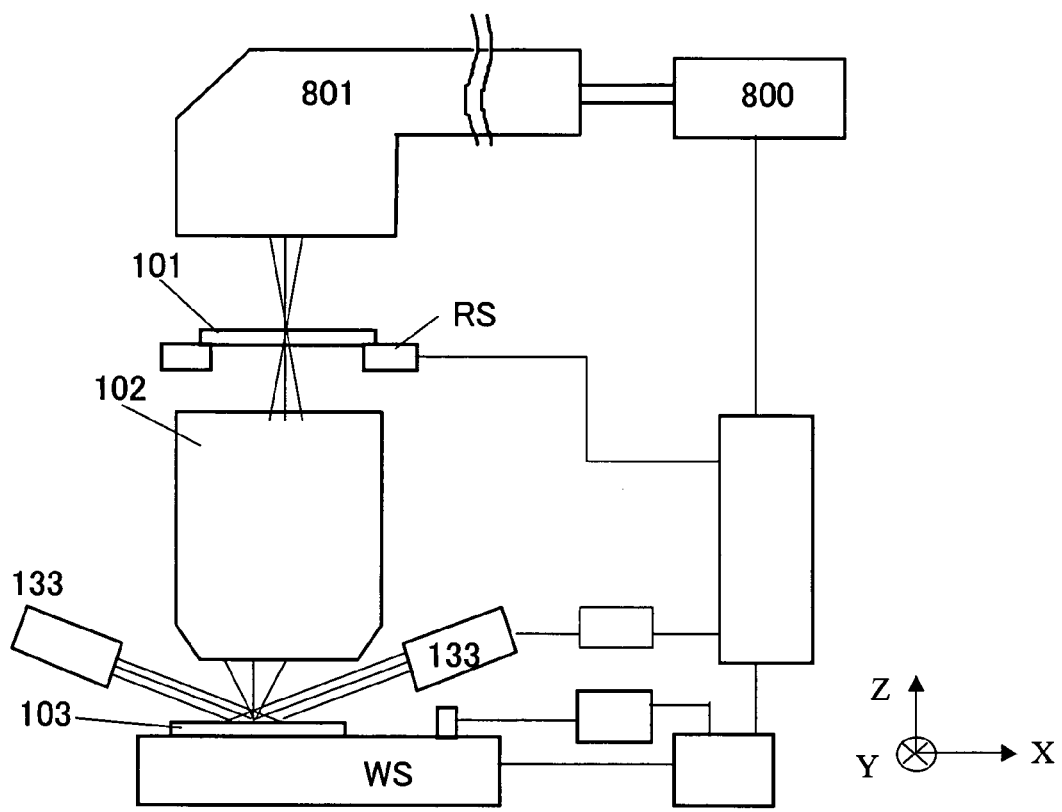
FIG. 13 is a block diagram of a schematic structure of a conventional exposure apparatus.
Figure 14:
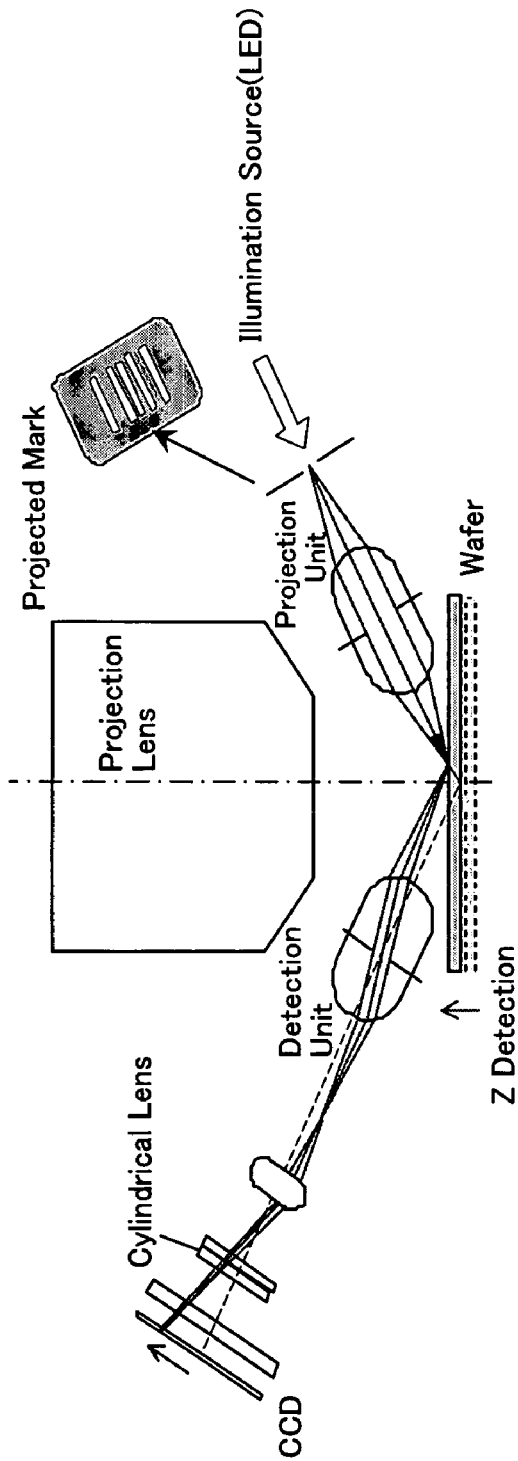
FIG. 14 is schematic structure of a focus and tilt detection system in the exposure apparatus shown in FIG. 13.

Referring now to FIGS. 11 and 12, a description will be given of an embodiment of a device manufacturing method using the above exposure apparatus S or S2. FIG. 11 is a flowchart for explaining a fabrication of devices (i.e., semiconductor chips such as IC and LSI, LCDs, CCDs, etc.). Here, a description will be given of a fabrication of a semiconductor chip as an example. Step 101 (circuit design) designs a semiconductor device circuit. Step 102 (reticle fabrication) forms a reticle having a designed circuit pattern. Step 103 (wafer preparation) manufactures a wafer using materials such as silicon. Step 104 (wafer process), which is referred to as a pretreatment, forms actual circuitry on the wafer through photolithography using the mask and wafer. Step 105 (assembly), which is also referred to as a posttreatment, forms into a semiconductor chip the wafer formed in Step 104 and includes an assembly step (e.g., dicing, bonding), a packaging step (chip sealing), and the like. Step 106 (inspection) performs various tests for the semiconductor device made in Step 105, such as a validity test and a durability test. Through these steps, a semiconductor device is finished and shipped (Step 107).

FIG. 12 is a detailed flowchart of the wafer process in Step 104. Step 111 (oxidation) oxidizes the wafer's surface. Step 112 (CVD) forms an insulating film on the wafer's surface. Step 113 (electrode formation) forms electrodes on the wafer by vapor disposition and the like. Step 114 (ion implantation) implants ions into the wafer. Step 115 (resist process) applies a photosensitive material onto the wafer. Step 116 (exposure) uses the exposure apparatus S or S2 to expose a circuit pattern of the reticle onto the wafer. Step 117 (development) develops the exposed wafer. Step 118 (etching) etches parts other than a developed resist image. Step 119 (resist stripping) removes disused resist after etching. These steps are repeated, and multilayer circuit patterns are formed on the wafer. The device manufacturing method of this embodiment may manufacture a higher quality device than the conventional method.

Further, the present invention is not limited to these preferred embodiments, and various variations and modifications may be made without departing from the scope of the present invention.

This application claims a benefit of priority based on Japanese Patent Application No. 2004-297158, filed on Oct. 12, 2004, which is hereby incorporated by reference herein in its entirety as if fully set forth herein.

What is claimed is:

1. An apparatus for measuring a shape of a surface of an object, the apparatus comprising:
    a structure to be faced to the surface of the object, the structure being made from a silicon-on-insulator including a first layer made of silicon, a second layer made of oxide silicon and located on the first layer and a third layer made of silicon and located on the second layer, an array of spaced flat silicon regions being formed from the first layer and serving as an array of probes, an array of spaced concave parts being formed in the third layer and respectively arranged above the array of spaced flat silicon regions, the structure being configured so that the third layer surrounds each of the array of spaced flat silicon regions and supports each of the array of spaced flat silicon regions via the second layer and each of the array of spaced flat silicon regions is movable relative to the third layer;
    an optical system configured to project a measurement light onto the second layer on one of the array of spaced flat silicon regions through corresponding one of the array of spaced concave parts and to receive the measurement light reflected off the second layer with respect to each of the array of spaced flat silicon regions; and
    a detector configured to detect the reflected measurement light from the optical system with respect to each of the array of spaced flat silicon regions.

2. An apparatus according to claim 1, wherein the structure is configured to be faced to a surface of a semiconductor wafer as the surface of the object.

3. An apparatus according to claim 1, wherein each of the array of spaced flat silicon regions has an area not less than 900 nm$^2$.

* * * * *